United States Patent
Jeon et al.

(10) Patent No.: US 7,315,057 B2
(45) Date of Patent: Jan. 1, 2008

(54) SPLIT GATE NON-VOLATILE MEMORY DEVICES AND METHODS OF FORMING SAME

(75) Inventors: Hee Seog Jeon, Hwasung (KR); Sung-Taeg Kang, Seoul (KR); Hyok-Ki Kwon, Yongin (KR); Yong Tae Kim, Yongin (KR); BoYoung Seo, Anyang (KR); Seung Beom Yoon, Suwon (KR); Jeong-Uk Han, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/368,154

(22) Filed: Mar. 3, 2006

(65) Prior Publication Data

US 2006/0202255 A1    Sep. 14, 2006

(30) Foreign Application Priority Data

Mar. 14, 2005    (KR) .................. 10-2005-0021074

(51) Int. Cl.
*H01L 29/788* (2006.01)
*H01L 21/336* (2006.01)

(52) U.S. Cl. .................. 257/315; 257/319; 257/321; 257/E29.264; 257/E21.422; 438/257; 438/267

(58) Field of Classification Search ................ 257/315, 257/316, 319–321, E29.264, E21.422; 438/257, 438/264, 266, 267
See application file for complete search history.

(56) References Cited

U.S. PATENT DOCUMENTS

| | | | |
|---|---|---|---|
| 6,329,685 B1 * | 12/2001 | Lee ................. | 257/314 |
| 6,727,545 B2 | 4/2004 | Wang et al. | |
| 6,737,700 B1 | 5/2004 | Chang et al. | |
| 6,873,006 B2 * | 3/2005 | Chen et al. ........ | 257/316 |
| 6,977,200 B2 * | 12/2005 | Kim et al. ......... | 438/257 |
| 7,037,783 B2 * | 5/2006 | Jeon et al. ......... | 438/257 |
| 7,176,085 B2 * | 2/2007 | Jeon et al. ......... | 438/257 |
| 2004/0027861 A1 * | 2/2004 | Ryu et al. ........ | 365/185.33 |
| 2007/0026613 A1 * | 2/2007 | Ryu et al. .......... | 438/266 |

FOREIGN PATENT DOCUMENTS

| | | |
|---|---|---|
| JP | 2002 0158302 | 5/2002 |
| KR | 2002 0022630 | 3/2002 |
| KR | 2004 0098106 | 11/2004 |

OTHER PUBLICATIONS

Patent Abstract of Japan for 2002-158302.
Korean Patent Abstract for 10-2002-0022630.
Korean Patent Abstract for 10-2004-0098106.

* cited by examiner

*Primary Examiner*—T. N. Quach
(74) *Attorney, Agent, or Firm*—F. Chau & Assoc, LLC

(57) ABSTRACT

Non-volatile memory devices and methods for fabricating non-volatile memory devices are disclosed. More specifically, split gate memory devices are provided having frameworks that provide increased floating gate coupling ratios, thereby enabling enhanced programming and erasing efficiency and performance.

17 Claims, 9 Drawing Sheets

| Operation Status | Control gate | Source(12) | Drain(13) | Substrate(11) |
|---|---|---|---|---|
| Discharge(Erase) | 12V | 0V | 0V | 0V |
| Charge (Program) | 1.5V | 9V | 0.5V | 0V |
| Read | 1.8V | 0V | 0.8V | 0V |

SPLIT GATE NON-VOLATILE MEMORY DEVICES AND METHODS OF FORMING SAME

CROSS-REFERENCE TO RELATED APPLICATION

This application claims priority to Korean Patent Application No. 2005-0021074, filed on Mar. 14, 2005, which is incorporated herein by reference.

TECHNICAL FIELD OF THE INVENTION

The present invention relates generally to non-volatile memory devices and methods for fabricating non-volatile memory devices. More specifically, the present invention relates to split gate memory devices having frameworks that provide increased floating gate coupling ratios, thereby enabling enhanced programming and erasing efficiency and performance.

BACKGROUND

In general, non-volatile memory devices are memory devices that will retain stored data even while power is off. Typically, non-volatile memory devices are utilized in various products and devices, such as mobile telecommunication devices, memory cards, smart cards, and other devices and applications where power is not always available, frequently interrupted and/or when lower power usage is required. In general, non-volatile memory devices include, for example, EPROM (Erasable and Programmable Read Only Memory) devices, EEPROM (Electrically Erasable and Programmable Read Only Memory) devices, SRAM and Flash Memory. More specifically, one type of non-volatile memory is known as split-gate, floating gate, EEPROM memory devices. These split-gate transistor memory devices are typically employed in various applications, particularly embedded systems, as such memory devices afford low cost, in system re-programmable, and highly reliable non-volatile memory solutions.

Figure 1A:
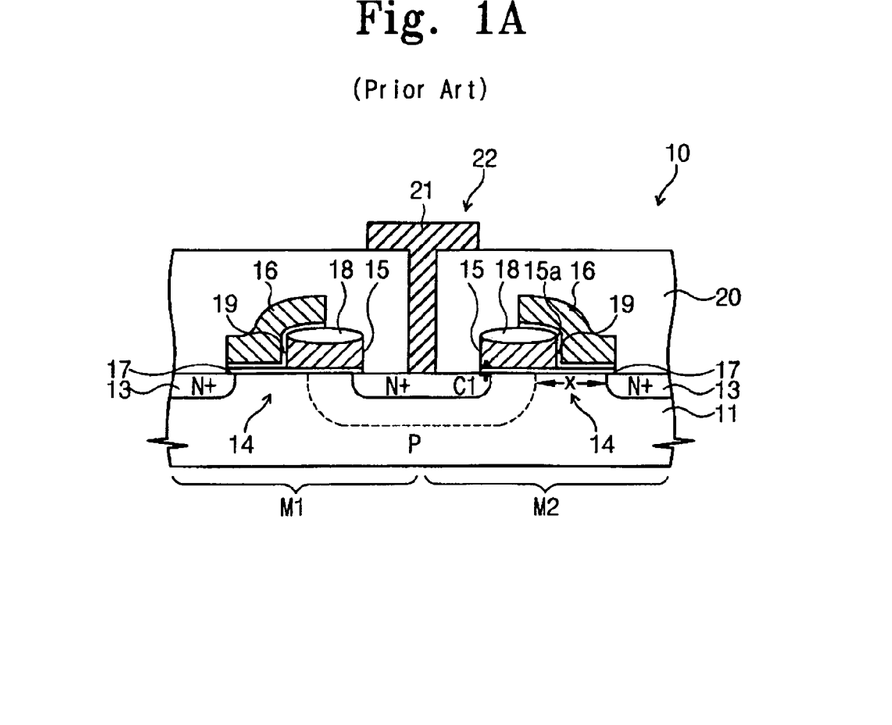
FIG. 1A is a cross-sectional schematic view of a conventional split gate non-volatile memory cell.

FIG. 1A illustrates a cross-sectional view of a conventional non-volatile split-gate memory device (10). In particular, FIG. 1A depicts a pair of split-gate memory cells M1 and M2 formed on a p-type semiconductor substrate layer (11). A plurality of n-type diffusion regions (12) and (13) are formed in the substrate (11). The diffusion region (12) is a common source region (12) that is shared by cells M1 and M2, and the diffusion regions (13) are drain regions. The memory cells M1 and M2 have mirror image structures with respect to the common source region (12). In particular, each cell M1, M2 comprises a channel region (14) between the common source region (12) and drain regions (13), a floating gate (15), a control gate (16), a gate insulation layer (17), a polyoxide layer (18) formed on the floating gate (15), and a tunnel insulating layer (19).

The floating gate (15) is an electrically isolated gate electrode, which is formed to overlap a portion of the channel region (14) and a portion of the common source region (12). The control gate (16) is formed to overlap a portion of the channel (14) adjacent the drain region (13), as well as overlap a sidewall and upper portion of the floating gate (15). The gate insulating layer (17) is formed over the substrate (11) to insulate the floating gate (15) and control gate (16) from the substrate (11). The polyoxide layer (18) is formed on the floating gate (15) by a local oxidation of silicon (LOCOS) process. The tunnel insulating layer (19) is disposed between the floating gate (15) and control gate (16), and covers one sidewall of the floating gate (15) and a portion of the channel region (14).

In one conventional design, each control gate (16) is a word line that extends in a row direction (orthogonal to the plane of the drawing page) and commonly connected to each memory cell along the rows. An interlayer dielectric layer (20) is formed over the memory cells M1, M2. A common source line (22) is patterned from a $1^{st}$ level metallization layer and connected to the common source region (12) by a contact plug (21). The common source line (22) extends in the same direction as the wordlines (or control gates (16)). The drain regions (13) are connected by a common bit line (not shown) that is formed from a second metallization layer and which extends orthogonal to the row direction. Each pair of rows that share a common source form a page.

In general, the memory cells MI and M2 are set to logical "1" or "0" depending on the charge stored in the respective floating gate electrodes (15). In particular, the floating gates (15) are used to change the threshold voltage of the memory cell transistor such that depending on the charge stored on the floating gate (15), the memory cell transistor is either in a high threshold state (non-conducting state) or a low threshold state (conducting state), wherein the conducting or non-conducting state is output as the logic level during a read operation.

In effect, each memory cell transistor is formed of a series connected memory transistor and a read/select transistor, wherein the memory transistor is formed by the floating gate (15) and portion of the channel (14) adjacent to, and overlapped by, the floating gate (15), and wherein the read/select transistor is formed by the control gate (16) and portion of the channel (14) adjacent to, and overlapped by, the control gate (16). The current flow through the channel (14) is controlled by the combination of the memory and read/select transistors, wherein the floating gate (15) essentially operates as an ON/OFF switch for the select/read transistor depending on the logical state of the memory cell.

In particular, in a programmed state (high threshold state), an excess of electrons are stored on the floating gate electrode (15). The memory cells M1 and M2 are programmed to a high threshold voltage using a technique know as CHE (Channel Hot Electron) SSI (source side injection) to inject electrons flowing in the channel (14) into the floating gate (15) through the gate insulating layer (17). These hot channel injected electrons are trapped on the floating gate electrode (15) and create a net negative voltage on the floating gate (15), which results in an increase in the threshold voltage required to change the memory cell from a non-conducting to a conducting state. During a read operation, the negatively charged floating gate (15) opposes an electric field created by a positive voltage applied to the control gate (16) of the read/select transistor. In effect, a programmed memory cell is in a non-conducting state because source-drain current does not flow when normal read/select control voltages are applied to the control gate (16) during a read operation.

On the other hand, in a non-programmed state (low threshold state), the floating gates (15) are devoid of negative charge (as compared to the programmed state). In particular, during an erase process, electrons on the floating gate (15) are transferred to the control gate (16) through the tunnel oxide layer (19) using a technique known as Fowler-Nordheim (FN) tunneling. When the memory cell is erased, the floating gate (15) is discharged to have a net positive charge that allows the memory cell transistor to be turned "ON" or "OFF", depending on the voltage on the control gate (16). When the memory cell is erased, a positive voltage on the floating gate (15) causes the portion of the channel (14) under the floating gate (15) to become inverted. In the non-programmed state, however, current flow in the channel (14) will be controlled by the voltage applied to the control gate (16).

Figure 1B:
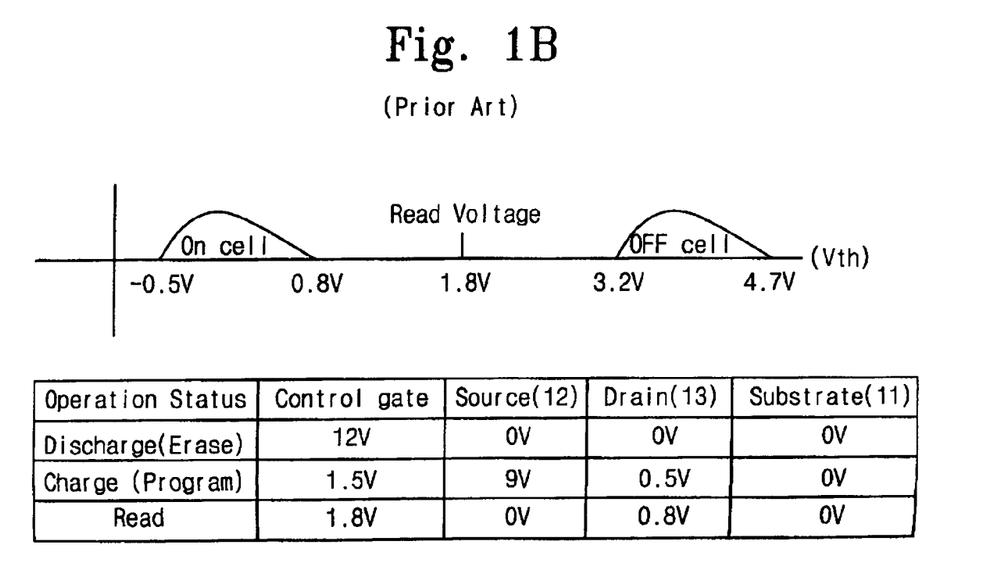
FIG. 1B is a table that illustrates operating conditions for the memory cell of FIG. 1A during an erase, program and read operation, according to the prior art.

FIG. 1B is a table that illustrates conventional operating conditions for the memory cells M1 and M2 during erase, program, and read operations. In the conventional scheme depicted in FIG. 1B, a read voltage is set to 1.8 volts. The threshold voltage $V_{th}$ for an "ON" (low threshold/non-programmed) memory cell is within a range of about –0.5V to 0.8V, and the $V_{th}$ for an "OFF" (high threshold/programmed) memory cell is about 3.2V to about 4.7V.

FIG. 1B illustrates operating voltages for performing a read operation. During a read cycle, the read voltage of 1.8 V is applied to the control gate (16) (word line), 0V is applied to both the source (12) and substrate (11), and a voltage of 0.8V is applied to the drain region (13) (bit line). Under these conditions, if the selected memory cell is in the "high threshold" or "OFF" state, the memory transistor will not conduct. The lack of current flowing through the selected bit line will be detected and output as a logic "0". On the other hand, if the selected memory cell is in the "low threshold" or "ON" state, then the memory transistor will conduct. The current, flowing through the selected bit line, will be detected and output as a logic "1".

FIG. 1B illustrates the operating voltages for an erase process to discharge the floating gate (15). During an erase process, the drain (13), source (12) and substrate (11) are set to 0V and a predetermined voltage (12V or greater) is applied to the control gate (16). The high voltage on the control gate (16) creates a strong electric field that initiates FN tunneling, such that electrons in the floating gate (15) are transferred from the floating gate (15) to the control gate (16) through the tunnel insulating layer (19). During erasing, an strong electric field is concentrated at an acute region (15a) (see, FIG. 1A) formed at a rim of the floating gate (15), and the FN tunneling occurs at the vicinity of such acute region (15a). As negative charge is transferred from the floating gate (15) and positive charge accumulates on the floating gate (16), the FN tunneling mechanism will continue until there is insufficient voltage across the tunnel oxide (19) to sustain the FN tunneling mechanism. As noted above, the positive charge on the floating gate (15) places the memory cell into a "low threshold" state, allowing the cell to conduct during a read operation (and thus being read as a logical "1").

FIG. 1B further illustrates operating voltages for a program operation. As noted above, the memory cells M1, M2 are programmed by source side channel hot electron injection. During programming, a voltage of 1.5V is applied to the control gate (16), which is sufficient to activate the channel (14) under the control gate (16). Furthermore, a voltage of 0.5V is applied to the drain (13), a voltage of 0V is applied to the substrate (11), and a relatively large source voltage of 9V is applied to the source (12) via the source line (22). The source-to-drain voltage differential generates channel hot electrons. The source voltage is capacitively coupled to the floating gate (15) via capacitance C1, which creates an electric field between the floating gate (15) and the channel (14). As the electrons flow from the drain (13) to the source (12) and gain kinetic energy, the path of such electrons is altered by the electric field between the floating gate and substrate. Those electrons with sufficient energy to overcome the substrate-gate oxide (Si—SiO2) barrier will accelerate from the channel (14) toward the floating gate electrode (15) through the gate oxide (17), and be trapped on the floating gate electrode (15). As negative charge accumulates on the floating gate (15), the positive charge generated during an erasing process is neutralized, and the hot channel electron injection will continue until there is insufficient voltage differential to sustain the injection mechanism. As noted above, the negative charge on the floating gate (15) places the memory cell into a "high threshold" state, preventing the cell to conduct during a read operation (and thus being read as a logical "0").

Although the conventional split-gate memory framework of FIG. 1A provides advantages over other conventional non-volatile memory designs, the split-gate framework of FIG. 1A can suffer performance problems with respect to data retention and cycling endurance. For instance, as noted above, an erase operation requires application of a high-voltage (e.g., 12V or greater) to the control gate (16) to initiate tunneling through the tunneling oxide (19) from the floating gate (15) to the control gate (16). Over time, the continuous application of such high voltage to the control gate (16) can adversely affect and stress the dielectric material of the tunneling layer (19) causing defects that can lead to unpredictable device reliability, especially for thin tunneling oxide layers.

Moreover, with respect to programming, although source side hot channel injection is a highly efficient programming technique, the conventional split gate memory framework of FIG. 1A affords a relatively low degree of capacitive coupling between the source (12) and the floating gate (15). In particular, as depicted in FIG. 1A, the coupling ratio C1 is limited by the overlapping area between the common source (12) and the floating gate (15). An increased coupling ratio yields increased programming speed. In the conventional design, a relatively large source voltage of 9V must be applied to the source region to effectively increase the coupling ratio by increasing the lateral diffusion of the source region (12).

However, a large source voltage applied to the source region (12) can result punch-through and junction breakdown due an increase of a source depletion region (12a). Indeed, the increased lateral diffusion of the source depletion region (12a) can result in punch through near the source region (12) due to excessive current. As the conventional framework of FIG. 1A is scaled to smaller design rules, the ability to use large source voltages is limited as the required gap X1 margin decreases.

SUMMARY OF THE INVENTION

In general, exemplary embodiments of the invention include non-volatile memory devices and methods for fabricating non-volatile memory devices. More specifically, exemplary embodiments of the invention include split gate memory devices having frameworks that provide increased floating gate coupling ratios, thereby enabling enhanced programming and erasing efficiency and performance.

In one exemplary embodiment, a split-gate memory cell framework is provided for implementing non-volatile memory. A split-gate memory cell includes first and second diffusion regions formed in a semiconductor substrate. A floating gate electrode is formed on the semiconductor substrate between the first and second diffusion regions, wherein a first side of the floating gate electrode overlaps a portion of the first diffusion region. A control gate electrode is formed on the semiconductor substrate between a second side of the floating gate electrode and the second diffusion region. A tunneling dielectric layer disposed between the control gate electrode and the second side of the floating gate electrode. A coupling gate electrode is formed on the first diffusion region in the semiconductor substrate and adjacent to the first side and an upper surface of the floating gate electrode. A coupling dielectric layer disposed between the coupling gate electrode and the first side and upper surface of the floating gate electrode. An insulating spacer formed between the control gate and the coupling gate.

In the exemplary split gate cell framework, the coupling gate yields an increased coupling ratio between the floating gate and common diffusion (e.g., source) region. The increased coupling ratio is obtained by the capacitive coupling in the area between a sidewall of the floating gate electrode and the coupling gate electrode as well as the capacitive coupling in the area between the upper surface of the floating gate electrode and the coupling gate electrode.

In another exemplary embodiment of the invention, the floating gate may be formed having an asymmetric shape to enable more efficient FN tunneling erase efficiency. For instance, in one embodiment, the first side of the floating gate electrode (adjacent the coupling gate) can be formed thicker than the second side of the floating gate electrode (adjacent the control gate electrode). In another embodiment, the first side of the floating gate electrode may have an acute, tip-shaped structure. In yet another embodiment, the upper surface of the floating gate electrode is sloped down from the first side of the floating gate electrode to the second side of the floating gate electrode.

In all such embodiment, the asymmetric shape of the floating gate electrodes provides a decrease in area along the floating gate electrode from the first side to the second side of the floating gate electrode adjacent the control gate to thereby yield a relatively strong concentrated field across the tunneling oxide layer between the control gate electrode and second side of the floating gate electrode and, thus, more readily initiate FN tunneling, even while using lower control voltages applied to the control gate electrode.

In another exemplary embodiment of the invention, a method is provided for fabricating a split-gate memory cell array, a floating gate electrode is formed on a semiconductor substrate, wherein the floating gate electrode is formed having a varying thickness along a length thereof and having a first side with a greatest thickness. A first dielectric layer is formed on the floating gate electrode. A first diffusion region is formed in the semiconductor substrate adjacent the first side of the floating gate electrode, wherein the first diffusion region is formed such that a first side of the floating gate electrode overlaps the first diffusion region. A coupling gate electrode is formed over the first dielectric layer on the first side of the floating gate electrode and on an upper surface of the floating gate electrode. A spacer is formed on the upper surface of the floating gate electrode adjacent the coupling gate electrode and substantially aligned to a second side of the floating gate electrode, wherein the second side has a thickness that is less than the thickness of the first side of the floating gate electrode. A control gate electrode is formed adjacent to the spacer and to the second side of the floating gate electrode. A second diffusion region is formed in the semiconductor substrate adjacent to the control gate electrode.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

Figure 2A:
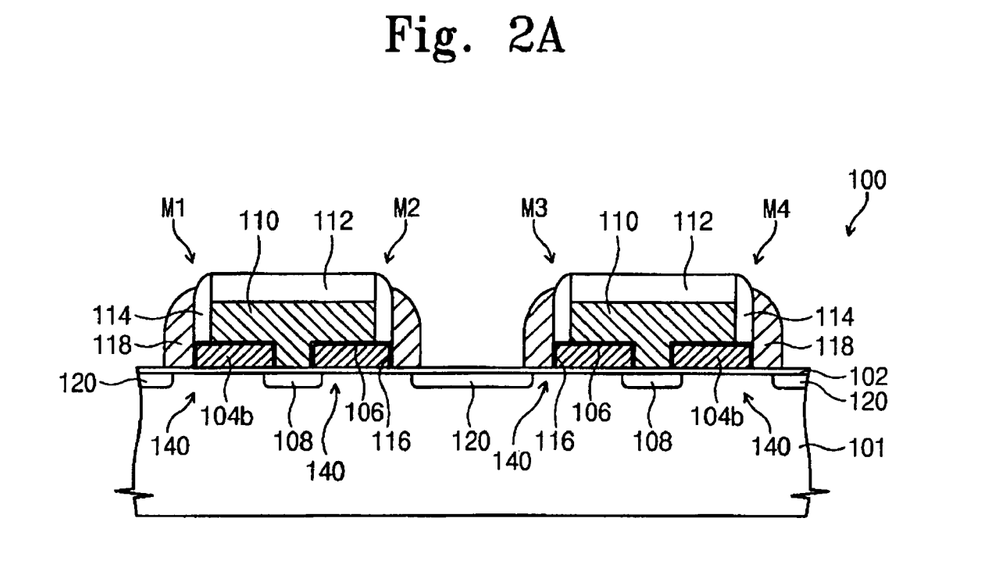
FIGS. 2A and 2B are cross-sectional schematic views of a split gate non-volatile memory cell according to an exemplary embodiment of the invention.
Figure 2B:
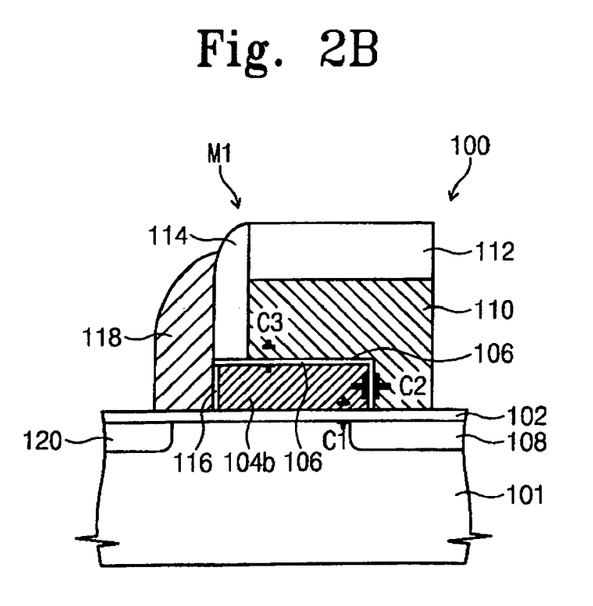

FIGS. 2A and 2B are cross-sectional schematic views of a split gate non-volatile memory device (100) according to an exemplary embodiment of the invention. In particular, FIG. 2A depicts two pairs of split-gate memory cells M1/M2 and M3/M4 formed on a p-type semiconductor substrate layer (101). A plurality of diffusion regions (108) and (120) are formed in the substrate (101). In particular, in one exemplary embodiment, the diffusion regions (108) are common source regions (108) shared between the memory cell pairs M1/M2 and M3/M4, and the diffusion regions (120) are drain regions. The memory cell pairs M1/M2 and M3/M4 have mirror image structures with respect to the common source region (108).

In particular, each memory cell M1-M4 includes a channel region (140), a gate insulation layer (102), a floating gate electrode (104b), a control gate electrode (118) (or erase control gate), a tunneling dielectric layer (116), a coupling gate electrode (110) (or program control gate), a coupling dielectric layer (106), insulating spacers (114), and a capping layer (112).

The channel regions (140) are between common source regions (108) and drain regions (120). The gate insulation layer (102) is formed on the substrate to insulate the various gate electrodes (104b), (110) and (118) from the active silicon substrate (101). Each floating gate electrode (104b) is formed over the semiconductor substrate (101) between the diffusion regions (108) and (120), wherein a first side of the floating gate electrode (104b) overlaps a portion of the common source region (108). The control gate electrode (118) is formed on the semiconductor substrate (101)

between a second side of the floating gate electrode (104b) and the drain diffusion region (120). The tunneling dielectric layer (116) is disposed between the control gate electrode (118) and the second side of the floating gate electrode (104b). The coupling gate electrode (110) is formed on the source region (108) and adjacent to the first side and an upper surface of the floating gate electrode (104b). The coupling dielectric layer (106) is disposed between the coupling gate electrode (110) and the first side and upper surface of the floating gate electrode (104b). The insulating spacers (114) are formed between the control gate (118) and the coupling gate (110). The capping layer (112) is formed on top of the coupling gate electrode (110).

The exemplary split gate memory framework of FIG. 2A provides various advantages and increased performance over the conventional framework of FIG. 1A. For instance, as depicted in FIG. 2B, the coupling gate (110) of the split-gate memory framework yields an increased coupling ratio between the floating gate (104b) and common source (108) region. Indeed, the increased coupling ratio is obtained by the additional capacitive coupling C2 in the area between the sidewall of the floating gate electrode (104b) and the coupling gate (110) and the additional capacitive coupling C3 in the area between the upper surface of the floating gate electrode (104b) and the coupling gate electrode (110). In the exemplary split-gate framework of FIGS. 2A and 2B, the coupling ratio to the floating gate (104b) is C1+C2+C3, which is greater than the coupling ratio C1 of the conventional split-gate design of FIG. 1A.

It is to be appreciated that the increased coupling ratio (C1+C2+C3) allows a smaller source voltage to be applied to the source region (108) during a hot channel electron source side injection programming process without reduction is programming efficiency or programming speed. Furthermore, as compared to the conventional design, the application of a smaller source voltage to the source region (108) results in a reduction is the size of the depletion region that is formed from the source region (108), thus reducing possibility of punch through and junction break-down of source region.

It is to be further appreciated that the exemplary split gate framework of FIGS. 2A, 2B provides increased performance and reliability with regard to erasing using FN tunneling. For instance, the increased coupling between the floating gate (104b) and source region (108) (where source voltage is held at 0V) enables a smaller voltage to be applied to the control gate (118) (smaller than 12V) while generating an electric field across the tunneling layer (116), which is strong enough to initiate FN tunneling from the floating gate (104b) to the control gate (118) during an erase process.

Figure 3A:
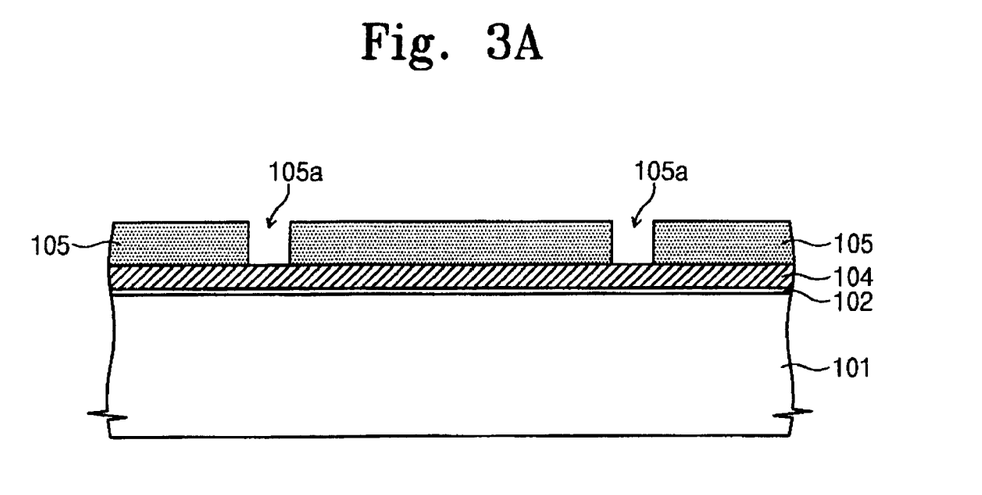
FIGS. 3A~3E are cross-sectional schematic views of the split-gate memory cell depicted in FIG. 2A at various stages of a method for fabricating the split-gate non-volatile memory cell, according to an exemplary embodiment of the invention.

FIGS. 3A through 3E are cross-sectional views illustrating a method for fabricating a split gate memory device of FIG. 2A, according to an exemplary embodiment of the invention. Referring initially to FIG. 3A, a gate insulation layer (102) and a polysilicon layer (104) are formed on a semiconductor substrate layer (101). In one exemplary embodiment, the substrate layer (101) is of p-type conductivity. The gate insulation layer (102) can be formed using conventional techniques. For instance, the gate insulation layer (102) can be a silicon oxide layer (SiO2) that is grown using a thermal oxidation process. In one exemplary embodiment of the invention, the gate insulation layer (102) is formed having a thickness in a range of about 60 Å to about 100 Å.

The polysilicon layer (104) can be formed using known techniques such as CVD (chemical vapor deposition). In one exemplary embodiment, the polysilicon layer (104) is formed having a thickness in a range of about 1000 Å to about 2500 Å. A photoresist mask (105) is formed on the polysilicon layer (104) using known techniques. The photoresist mask (105) is formed having openings (105a) that expose portions of the polysilicon layer (104).

Figure 3B:
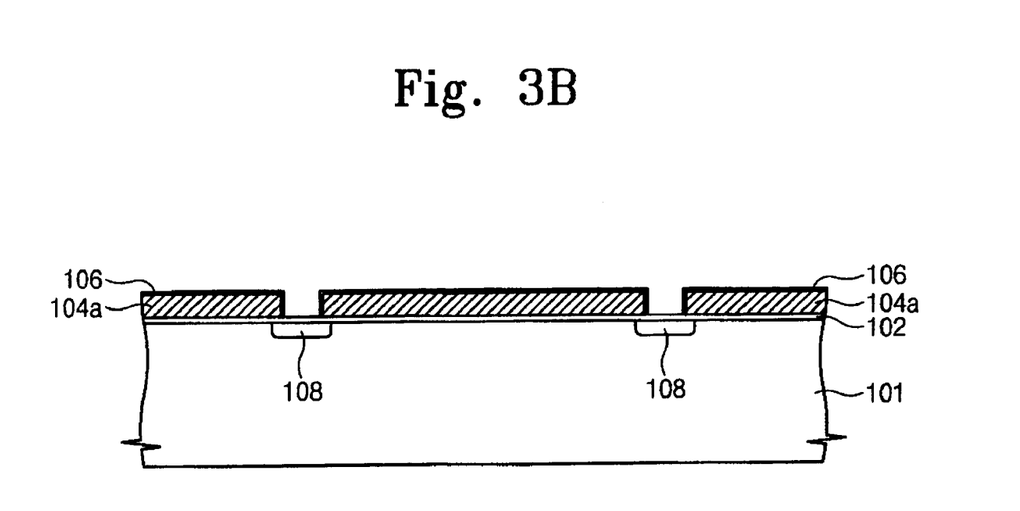

Referring to FIG. 3B, the photoresist mask (105) is used as a etch mask for etching the exposed portions of the polysilicon layer (104) down to the gate oxide layer (102) to form a first floating gate pattern (104a). Next, a coupling oxide layer (106) is formed on the surfaces of the first floating gate pattern (104a). In one embodiment, the coupling oxide layer (106) is formed using thermal oxidation, and the oxide layer (106) is formed having a thickness in a range of about 100 Å to about 200 Å. An ion implantation process is performed to form N+ common source regions (108).

Figure 3C:
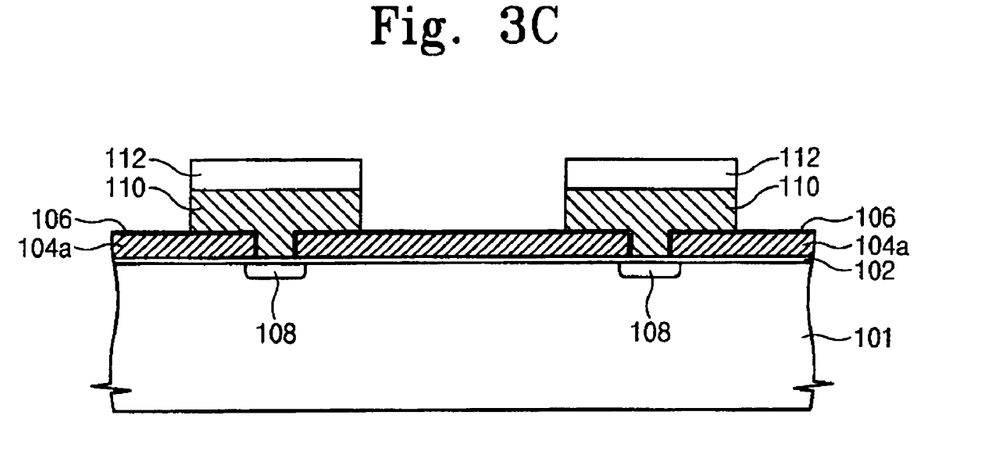

Referring to FIG. 3C, stacked gate structures (110/112) comprising coupling gate electrodes (110) and capping layers (112) are formed using known techniques. For instance, in one exemplary embodiment, the stacked gate structures are formed by sequentially forming a polysilicon layer (coupling gate layer) and an oxide layer (capping layer) over the coupling oxide layer (106). In one exemplary embodiment, the polysilicon layer is formed to have a thickness in a range of about 1000 Å to about 2000 Å, and the oxide layer is formed having a thickness of about 500 Å to about 2000 Å. Conventional etching methods are then applied to etch the polysilicon and oxide layers down to the coupling oxide layer (106) to form stacked gate structures (110/112).

Figure 3D:
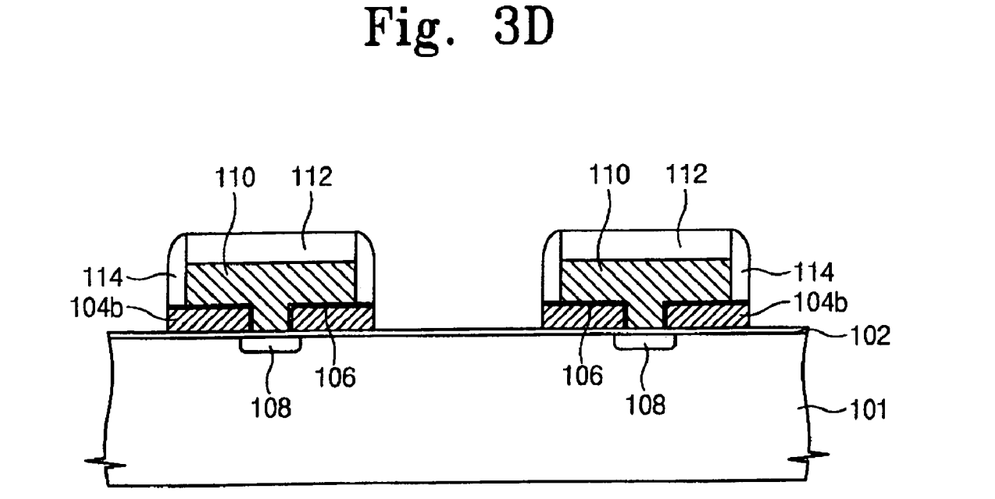

Referring to FIG. 3D, an insulation layer is formed over the stacked gate structures (110/112) and subsequently etched to form spacers (114) on the sidewalls of the gate stacks (110/112). The spacers (114) may be formed of silicon oxide using known techniques. Thereafter, a etch process is performed using the capping dielectric layers (112) and spacers (114) as an etch mask to etch the exposed portions of the coupling oxide layer (106) and first floating gate pattern (104a) down to the gate insulation layer (102) to thereby form the floating gate electrodes (104b).

Figure 3E:
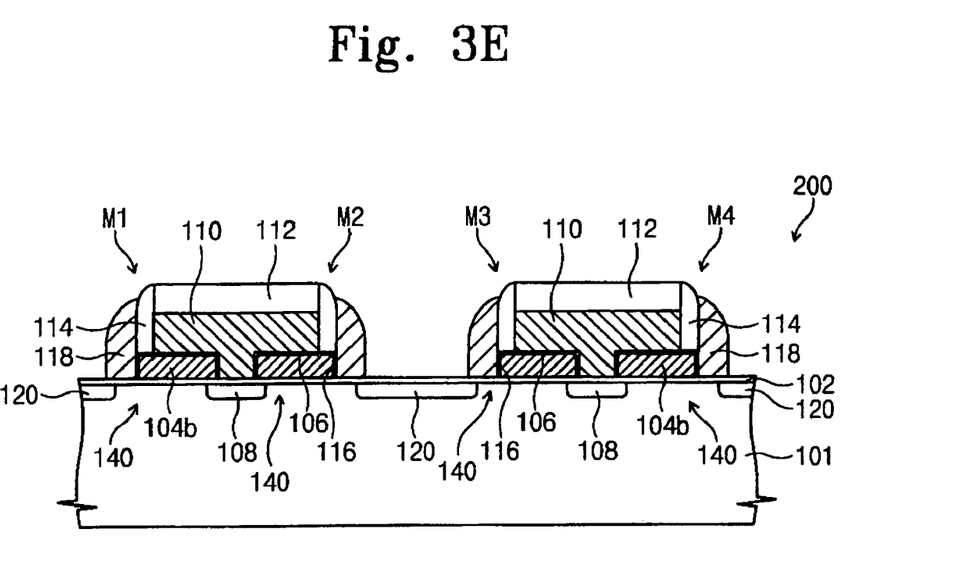

Referring to FIG. 3E, tunneling oxide layers (116) are formed on the exposed sidewall surfaces of the floating gate electrodes (104b) (of FIG. 3D). In one exemplary embodiment, the tunneling oxide layers (116) are formed using a thermal oxidation process. In one exemplary embodiment, the tunneling oxide layers (116) are formed having a thickness in a range of about 50 Å to about 90 Å. Thereafter, the control (erase) gate electrodes (118) are formed on the sidewalls of the spacers (114) and tunneling oxide layers (116). The control gate electrodes (118) may be formed by depositing a conformal layer of polysilicon in an amount of about 2000 Å to about 3000 Å, and the etching the polysilicon layer using a suitable etch process to form the control electrodes (118). Then, an ion implantation process is performed to form drain regions (120) using known techniques.

Figure 4:
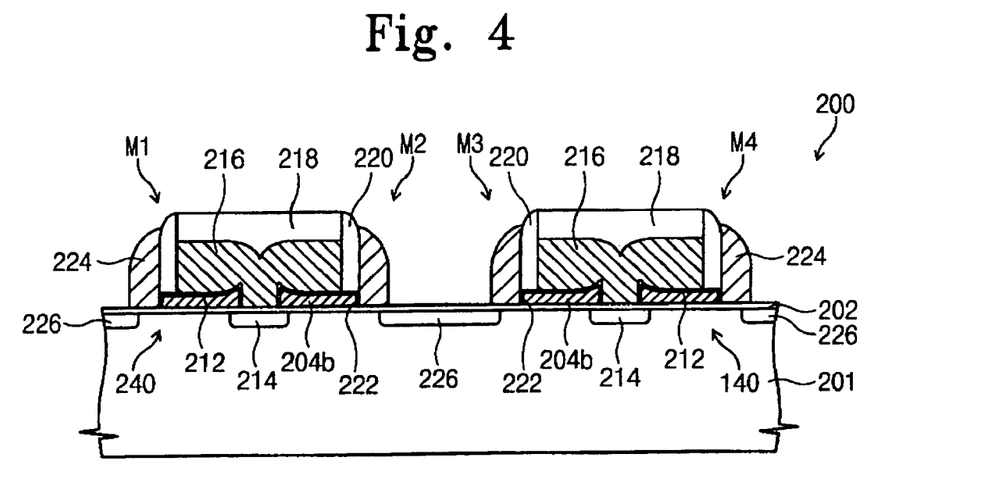
FIG. 4 is a cross-sectional schematic view of a split gate non-volatile memory cell according to another exemplary embodiment of the invention.

FIG. 4 is a cross-sectional schematic view of a split gate non-volatile memory device (200) according to an exemplary embodiment of the invention. In particular, FIG. 4 depicts a two pairs of split-gate memory cells M1/M2 and M3/M4 formed on a p-type semiconductor substrate layer (201). A plurality of diffusion regions (214) and (226) are formed in the substrate (201). In particular, in one exemplary embodiment, the diffusion regions (214) are common source regions (214) shared between the memory cell pairs M1/M2 and M3/M4, and the diffusion regions (226) are drain regions. The memory cell pairs M1/M2 and M3/M4 have mirror image structures with respect to the common source region (214).

In particular, each memory cell M1~M4 includes a channel region (240), a gate insulation layer (202), a floating gate electrode (204b), a control gate electrode (224) (or erase control gate), a tunneling dielectric layer (222), a coupling gate electrode (216) (or program control gate), a coupling dielectric layer (212), insulating spacers (220), and a capping layer (218).

The channel regions (240) are between common source regions (214) and drain regions (226). The gate insulation layer (202) is formed on the substrate (201) to insulate the various gate electrodes (204b), (224) and (216) from the active silicon substrate (201). The floating gate electrode (204b) is formed over the semiconductor substrate (201) between the diffusion regions (214) and (225), wherein a first side of the floating gate electrode (204b) overlaps a portion of the common source region (214). In one exemplary embodiment, the first side of the floating gate electrode (204b) is thicker than the second side of the floating gate electrode (204b). The first side of the floating gate electrode (204b) forms a tip-shaped structure. Moreover, the upper surface of the floating gate electrode (204b) is sloped down from the first side of the floating gate electrode to the second side of the floating gate electrode.

The control gate electrode (224) is formed on the semiconductor substrate (201) between the second side of the floating gate electrode (204b) and the drain diffusion region (226). The tunneling dielectric layer (222) is disposed between the control gate electrode (224) and the second side of the floating gate electrode (204b). The coupling gate electrode (216) is formed on the source region (214) and adjacent to the first side and a sloped upper surface of the floating gate electrode (204b). The coupling dielectric layer (212) is disposed between the coupling gate electrode (216) and the first side and upper surface of the floating gate electrode (204b). The insulating spacers (220) are formed between the control gate (224) and the coupling gate (216). The capping layers (218) are formed on top of the coupling gate electrodes (216).

The exemplary split gate memory framework of FIG. 4 provides various advantages and increased performance over the conventional framework of FIG. 1A for reasons similar to those discussed above with reference to FIGS. 2A and 2B. In particular, the coupling gate (216) of the split-gate memory framework yields an increased coupling ratio between the floating gate (204b) and common source (214) region by virtue of the additional coupling area between coupling gate (216) and the upper and sidewall surfaces of the floating gate (204b).

Furthermore, the asymmetric shape of the floating gate electrodes (204b) enable more efficient FN tunneling erase efficiency. Indeed, the decrease in area along the floating gate electrode (204b) from the first side (adjacent the source (214) to the second side of the floating gate electrode (204b) (adjacent the control gate (224)) yields a relatively strong concentrated field across the tunneling oxide layer (222) between the control gate electrode (224) and second side of the floating gate electrode (204b). The concentrated electric field at this smaller region of the floating gate electrode (204b) allows more efficient FN tunneling at lower control voltages applied to the control gate electrode (224).

Figure 5A:
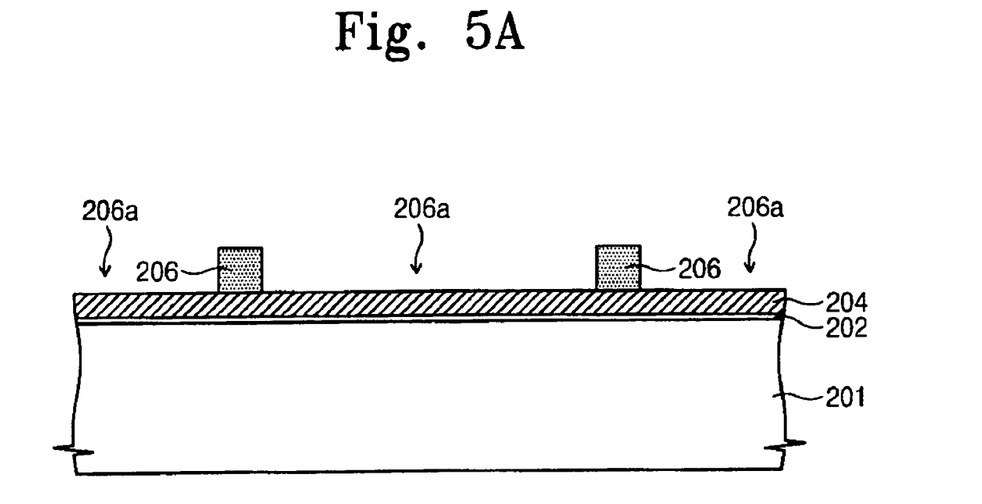
FIGS. 5A~5G are cross-sectional schematic views of the split-gate memory cell of FIG. 4 at various stages of a method for fabricating the split-gate non-volatile memory cell, according to an exemplary embodiment of the invention.

FIGS. 5A through 5G are cross-sectional views illustrating a method for fabricating a split gate memory device of FIG. 4, according to an exemplary embodiment of the invention. Referring initially to FIG. 5A, a gate insulation layer (202) and a polysilicon layer (204) are formed on a semiconductor substrate layer (201). In one exemplary embodiment, the substrate layer (201) is of p-type conductivity. The gate insulation layer (202) can be formed using conventional techniques. For instance, the gate insulation layer (202) can be a silicon oxide layer (SiO2) that is grown using a thermal oxidation process. In one exemplary embodiment of the invention, the gate insulation layer (202) is formed having a thickness in a range of about 60 Å to about 100 Å. The polysilicon layer (204) can be formed using known techniques such as CVD (chemical vapor deposition). In one exemplary embodiment, the polysilicon layer (104) is formed having a thickness in a range of about 1000 Å to about 2500 Å.

As further depicted in FIG. 5A, a hard mask (206) is formed on the polysilicon layer (204) using known techniques. For instance, the hard mask (206) can be formed by depositing and etching a layer of silicon nitride. layer The photoresist mask (105) is formed having openings (206a) that expose portions of the polysilicon layer (204).

Figure 5B:
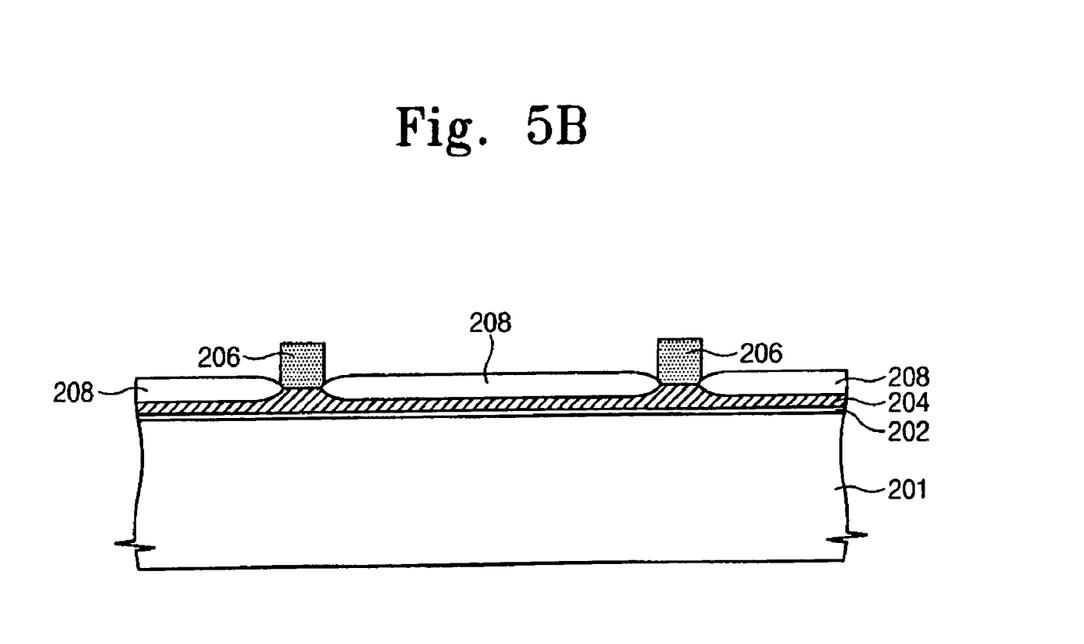

Referring to FIG. 5B, the hard mask (206) is used as a etch mask to form sacrificial oxide layers (208) on the exposed surfaces of the polysilicon layer (204). In one exemplary embodiment of the invention, the sacrificial oxide layers (208) are formed using a thermal oxidation process to grow thermal oxide layers having a thickness in a range of about 1000 Å to about 1500 Å.

Figure 5C:
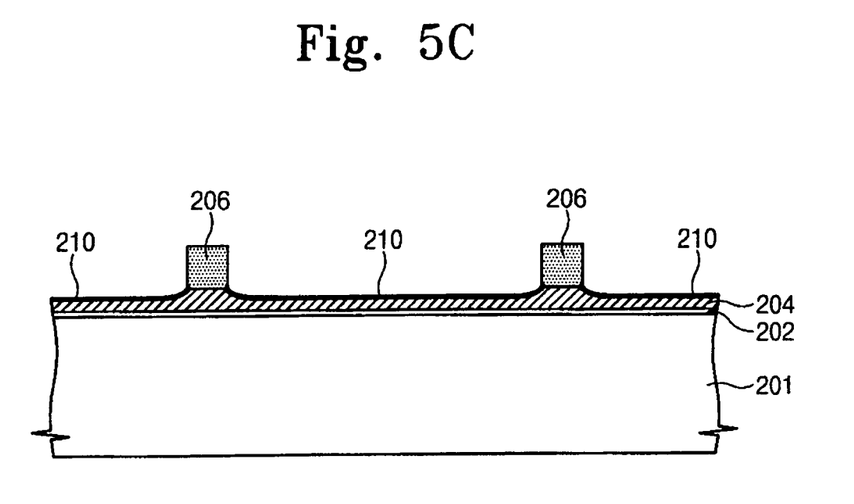

Referring to FIG. 5C, a suitable oxide etch process is performed to remove the sacrificial oxide layers (208). Thereafter, another thermal oxidation process is performed using the hard mask pattern (206) to grow an oxide layer (210) on the exposed surfaces of the polysilicon layer (204). In one exemplary embodiment of the invention, the oxide layer (210) is grown to a thickness in a range of about 100 Å to about 200 Å.

Figure 5D:
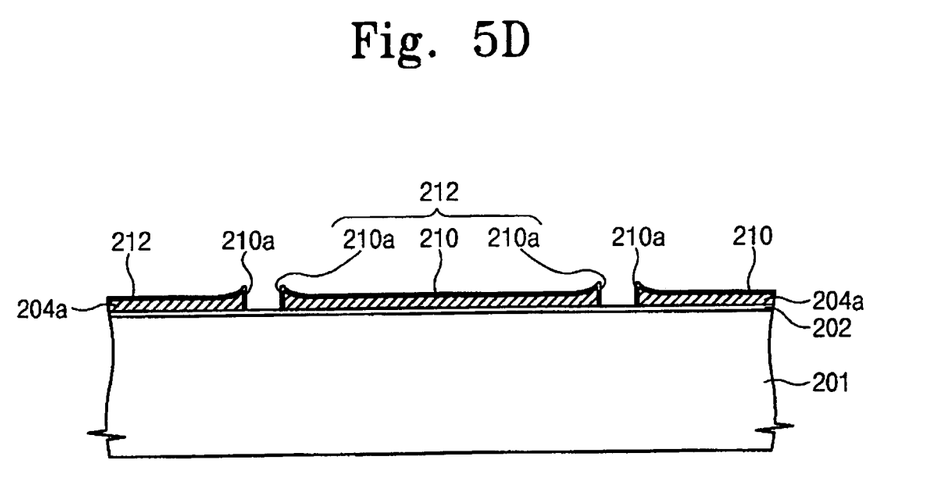

Referring to FIG. 5D, the hard mask pattern (206) is removed using known methods. Thereafter, the exposed portions of the polysilicon layer (204), which were previously covered by the mask pattern (206), are etched down to the gate insulating layer (203) using known techniques to form a floating gate pattern (204a). An oxidation process is then performed to grow an oxide layer (210a) on the exposed sidewall surfaces of the polysilicon floating gate pattern (204a). The oxide layers (110) and (110a) collectively form a coupling oxide layer (212) that encapsulates each potion of the floating gate pattern (204a).

Figure 5E:
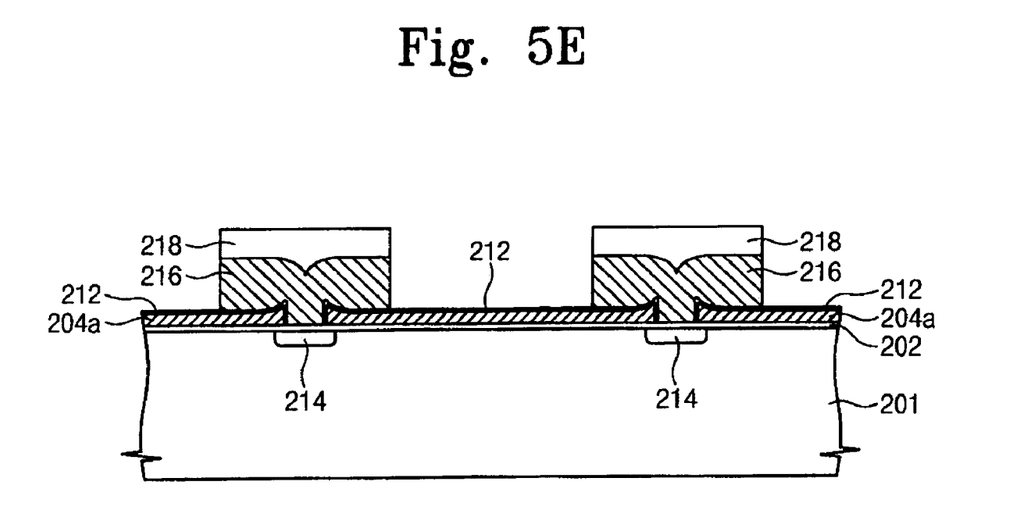

Referring to FIG. 5E, an ion implantation process is performed to form source diffusion regions (214). In one exemplary embodiment, the source diffusion regions (214) are N+ regions that are formed using any suitable n-type dopant material. Thereafter, stacked gate structures (216/218) comprising coupling (program) gate electrodes (216) and capping layers (218) are formed using known techniques. For instance, in one exemplary embodiment, the stacked gate structures are formed by sequentially forming a polysilicon layer (coupling (program) gate layer) and an oxide layer (capping layer) over the coupling oxide layer (212). In one exemplary embodiment, the polysilicon layer is formed to have a thickness in a range of about 1000 Å to about 2000 Å, and the oxide layer is a silicon oxide layer formed having a thickness of about 500 Å to about 1000 Å. Conventional etching methods are then applied to etch the polysilicon and silicon oxide layers down to the coupling oxide layer (212) to form stacked gate structures (216/218).

Figure 5F:
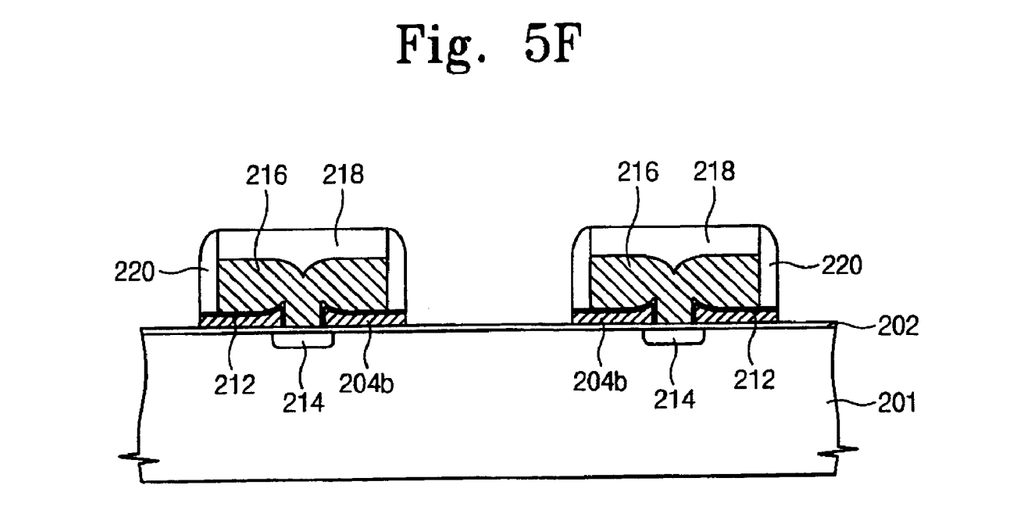

Referring to FIG. 5F, an insulation layer is formed over the stacked gate structures (216/218) and subsequently etched to form spacers (220) on the sidewalls of the stacked gate structures (216/218). The spacers (220) may be formed of silicon oxide using known techniques. Thereafter, an etch process is performed using the capping dielectric layers (218) and spacers (220) as an etch mask to etch the exposed portions of the coupling oxide layer (212) and floating gate pattern (204a) down to the gate insulation layer (202) to thereby form the floating gate electrodes (204b).

Figure 5G:
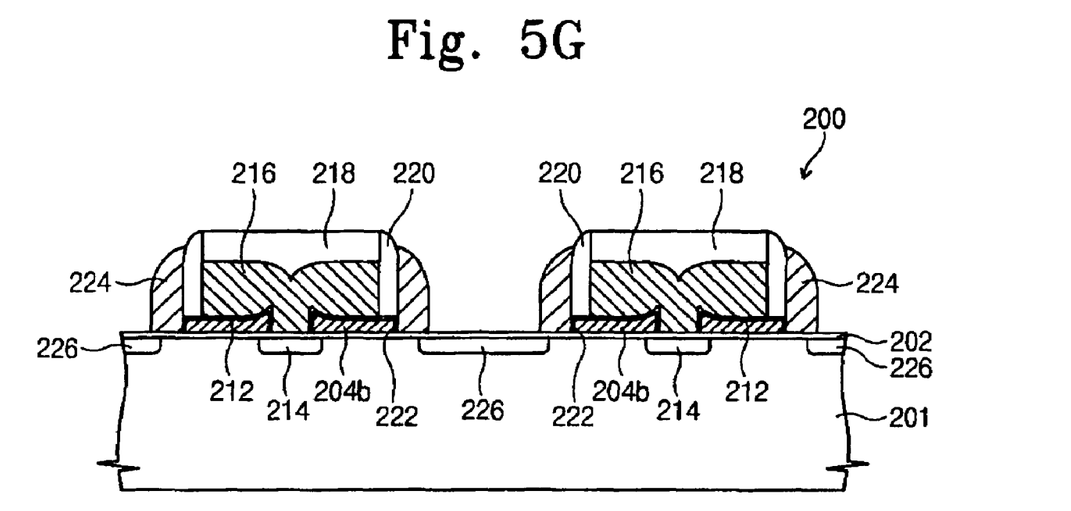

Referring to FIG. 5G, tunneling oxide layers (222) are formed on the exposed surfaces of the floating gate electrodes (204b) (of FIG. 5F). In one exemplary embodiment, the tunneling oxide layers (222) are formed using thermal oxidation to grow the tunneling oxide layers (222) on the exposed sidewall surfaces of the floating gate electrodes (204b). In one exemplary embodiment, the tunneling oxide layers (222) are formed having a thickness in a range of about 50 Å to about 90 Å. Thereafter, the control (erase) gate electrodes (224) are formed on the sidewalls of the spacers (220) and tunneling oxide layers (222). The control gate electrodes (224) may be formed by depositing a conformal layer of polysilicon in an amount of about 2000 Å to about 3000 Å, and the etching the polysilicon layer using a suitable anisotropic etch process to form the control electrodes (224). Then, an ion implantation process is performed to form N+ drain regions (226) using known techniques.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A split-gate memory cell, comprising:
    first and second diffusion regions formed in a semiconductor substrate;
    a floating gate electrode formed on the semiconductor substrate between the first and second diffusion regions, wherein a first side of the floating gate electrode overlaps a portion of the first diffusion region;
    a control gate electrode formed on the semiconductor substrate between a second side of the floating gate electrode and the second diffusion region;
    a tunneling dielectric layer disposed between the control gate electrode and the second side of the floating gate electrode;
    a coupling gate electrode formed on the first diffusion region in the semiconductor substrate and adjacent to the first side and an upper surface of the floating gate electrode;
    a coupling dielectric layer disposed between the coupling gate electrode and the first side and upper surface of the floating gate electrode; and
    an insulating spacer formed between the control gate and the coupling gate.

2. The memory cell of claim 1, wherein the first side of the floating gate electrode is thicker than the second side of the floating gate electrode.

3. The memory cell of claim 2, wherein the first side of the floating gate electrode forms a tip-shaped structure.

4. The memory cell of claim 2, wherein the upper surface of the floating gate electrode is sloped down from the first side of the floating gate electrode to the second side of the floating gate electrode.

5. The memory cell of claim 1, wherein the tunneling dielectric layer has a thickness in a range of about 50 Å to about 90 Å.

6. The memory cell of claim 1, wherein the coupling dielectric layer has a thickness in a range of about 100 Å to about 200 Å.

7. The memory cell of claim 1, wherein the coupling gate electrode is connected to a power supply line.

8. The memory cell of claim 1, further comprising a capping layer formed on an upper surface of the coupling gate electrode.

9. The memory cell of claim 1, further comprising a gate insulation layer formed between the semiconductor substrate and the floating gate electrode.

10. A method for fabricating a split-gate memory cell array, comprising:
    forming a floating gate electrode on a semiconductor substrate, wherein the floating gate electrode is formed having a varying thickness along a length thereof and having a first side with a greatest thickness;
    forming a first dielectric layer on the floating gate electrode;
    forming a first diffusion region in the semiconductor substrate adjacent the first side of the floating gate electrode, wherein the first diffusion region is formed such that a first side of the floating gate electrode overlaps the first diffusion region;
    forming a coupling gate electrode over the first dielectric layer on the first side of the floating gate electrode and on an upper surface of the floating gate electrode;
    forming a spacer on the upper surface of the floating gate electrode adjacent the coupling gate electrode and substantially aligned to a second side of the floating gate electrode, the second side having a thickness that is less than the thickness of the first side of the floating gate electrode;
    forming a control gate electrode adjacent to the spacer and to the second side of the floating gate electrode; and
    forming a second diffusion region in the semiconductor substrate adjacent to the control gate electrode.

11. The method of claim 10, wherein forming the floating gate electrode comprises:
    forming a polysilicon layer on the semiconductor substrate;
    forming a hard mask on the polysilicon layer to expose a portion of the polysilicon layer;
    forming a sacrificial oxide layer having a varying thickness on the exposed portion of the polysilicon layer;
    removing the sacrificial oxide layer;
    forming a first insulating layer on the upper surface of the exposed portion of the polysilicon surface;
    removing the hard mask; and
    etching the polysilicon layer using the first insulating layer as a mask to define the first side of the floating gate electrode.

12. The method of claim 11, wherein forming the first dielectric layer on the floating gate electrode comprises forming a second insulating layer on the first side of the floating gate electrode, wherein the first and second insulating layers form the first dielectric layer.

13. The method of claim 11, wherein forming a sacrificial oxide layer is performed by thermal oxidation of the polysilicon layer.

14. The method of claim 10, wherein the first dielectric layer is formed to have a thickness in a range of about 50 Å to about 200 Å.

15. The method of claim 10, wherein the second dielectric layer is formed to have a thickness in a range of about 40 Å to about 100 Å.

16. The method of claim 10, wherein forming the coupling gate electrode comprises:

forming a stacked layer comprising a second polysilicon layer on the semiconductor substrate and a capping layer on the polysilicon layer;

patterning the capping layer to form a mask layer; and etching the second polysilicon layer using the mask layer to form the coupling gate electrode having an insulating cap on an upper surface thereof.

17. The method of claim 10, further comprising etching the floating gate electrode using the spacer and insulating cap as a mask to form the second side of the floating gate electrode.

* * * * *